(12) United States Patent
Iwata et al.

(10) Patent No.: US 9,018,574 B2
(45) Date of Patent: Apr. 28, 2015

(54) DRIVING AN IMAGE APPARATUS BY SIMULTANEOUS APPLICATION OF TWO RESET VOLTAGES

(75) Inventors: Koichiro Iwata, Kawasaki (JP);
Tomoyuki Noda, Kawasaki (JP);
Takeshi Akiyama, Kawasaki (JP);
Kazumichi Morita, Kawasaki (JP);
Kazuhiro Sonoda, Yokohama (JP);
Takuro Yamamoto, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 308 days.

(21) Appl. No.: 13/540,505

(22) Filed: Jul. 2, 2012

(65) Prior Publication Data
US 2013/0037696 A1 Feb. 14, 2013

(30) Foreign Application Priority Data
Aug. 10, 2011 (JP) ................. 2011-174970

(51) Int. Cl.
| H01L 27/146 | (2006.01) |
| H04N 5/365 | (2011.01) |
| H04N 5/378 | (2011.01) |
| H04N 5/3745 | (2011.01) |

(52) U.S. Cl.
CPC ........ *H01L 27/14643* (2013.01); *H04N 5/3658* (2013.01); *H04N 5/378* (2013.01); *H04N 5/37457* (2013.01)

(58) Field of Classification Search
CPC ....... H04N 3/155; H04N 5/335; H04N 5/369; H04N 5/378; H01J 40/14; G01J 1/44
USPC .................. 250/208.1, 214 R; 348/296–311; 257/290–292, 440
See application file for complete search history.

(56) References Cited

U.S. PATENT DOCUMENTS

| 5,032,975 | A | 7/1991 | Yamamoto et al. |
| 5,136,222 | A | 8/1992 | Yamamoto et al. |
| 6,078,663 | A | 6/2000 | Yamamoto |
| 6,597,790 | B1 | 7/2003 | Yamamoto |
| 6,892,162 | B2 | 5/2005 | Morita |
| 7,071,865 | B2 | 7/2006 | Shibamiya et al. |
| 7,138,696 | B2 | 11/2006 | Noda |

(Continued)

FOREIGN PATENT DOCUMENTS

| JP | 2008-219423 A | 9/2008 |
| JP | 2009-27267 A | 2/2009 |

(Continued)

*Primary Examiner* — Georgia Y Epps
*Assistant Examiner* — Carolynn A Moore
(74) *Attorney, Agent, or Firm* — Fitzpatrick, Cella, Harper & Scinto

(57) ABSTRACT

A driving method of an imaging apparatus comprises: horizontally transferring, by a horizontal scanning circuit, a signal based on a photoelectric conversion portion of a first pixel unit held in a signal holding capacitor to a common line; before ending of the horizontal transfer; applying, by a reset switch of a second pixel unit, a selection reset voltage to a floating diffusion region of the second pixel unit; and after the horizontal transfer, transferring, by a transfer switch of the second pixel unit, a signal of a photoelectric conversion portion of the second pixel unit to the floating diffusion region of the second pixel unit and amplifying, by an amplification transistor of the second pixel unit, a signal of the floating diffusion region of the second pixel unit to output the signal to an output line.

13 Claims, 10 Drawing Sheets

(56) References Cited

U.S. PATENT DOCUMENTS

| | | |
|---|---|---|
| 7,296,234 B2 | 11/2007 | Fukuda et al. |
| 7,496,278 B2 | 2/2009 | Miyamoto et al. |
| 7,522,087 B2 | 4/2009 | Shibamiya et al. |
| 7,787,037 B2 * | 8/2010 | Ono et al. .............. 348/296 |
| 7,795,698 B2 | 9/2010 | Noda |
| 7,937,346 B2 | 5/2011 | Kato et al. |
| 7,952,077 B2 * | 5/2011 | Tashiro et al. .......... 250/370.09 |
| 8,023,802 B2 | 9/2011 | Miyamoto et al. |
| 8,072,040 B2 | 12/2011 | Noda |
| 2009/0160424 A1 | 6/2009 | Yamamoto |
| 2009/0207292 A1 * | 8/2009 | Watanabe .............. 348/308 |
| 2010/0066884 A1 | 3/2010 | Ono et al. |
| 2011/0191568 A1 | 8/2011 | Yamamoto |
| 2012/0112539 A1 | 5/2012 | Yamamoto |
| 2012/0193549 A1 | 8/2012 | Noda |

FOREIGN PATENT DOCUMENTS

| | | |
|---|---|---|
| JP | 2011-97625 A | 5/2011 |
| JP | 2011-139350 A | 7/2011 |

* cited by examiner

(12)   United States Patent    US 9,018,574 B2

DRIVING AN IMAGE APPARATUS BY SIMULTANEOUS APPLICATION OF TWO RESET VOLTAGES

BACKGROUND OF THE INVENTION

1. Field of the Invention

The present invention relates to an imaging apparatus and a driving method of the imaging apparatus.

2. Description of the Related Art

In recent years, an imaging apparatus including an amplifying portion at a pixel section is proposed. Japanese Patent Application Laid-Open No. 2008-219423 discloses a configuration in which a plurality of pixels shares one amplification transistor. The imaging apparatus disclosed in Japanese Patent Application Laid-Open No. 2008-219423 controls a voltage of a floating diffusion region (hereinafter, "FD") as an input of the amplifying portion to select a pixel from which a signal will be read out.

SUMMARY OF THE INVENTION

The present inventors have found out that the voltage of the FD is not quickly stabilized when the pixel is selected in the conventional driving method of the imaging apparatus, and the voltage of the FD may continue to vary during a period after the selection operation. For example, if a predetermined voltage is applied to the FD to select a pixel, a voltage of a reference potential node (ground potential node) at the pixel section may be changed by coupling. The FD turns into an electrically floating state after the predetermined voltage is applied. Consequently, the voltage of the FD may be changed via a coupling between the FD and the reference potential node when the voltage of the changed reference potential node returns to the original voltage. If the change in the voltage of the FD is large in the selection of the pixel, the change in the voltage of the reference potential node is also large. In this case, it takes a long time for the voltage of the FD to stabilize. If the change in the voltage of the FD is small in the selection of the pixel, the change in the voltage of the reference potential node is also small. In this case, the voltage of the FD is stabilized in a relatively short time. Therefore, the time before the stabilization of the potential of the FD varies depending on the pixel.

The variation in the voltage of the FD may cause a difference in a reference voltage of the FD between, for example, a noise sampling (N reading) period and a signal sampling (S reading) period. In this case, the difference in the FD voltage tends to be large in the pixel from which the signal is read out first among a plurality of pixels that shares the FD. As a result, there is a problem that horizontally striped pattern noise (row difference) is generated only in a row including the pixel. The row difference is particularly prominent when the illumination is low. The effect that the row difference has on the image quality is prominent when pixels of the same color share the FD.

An object of the present invention is to provide an imaging apparatus and a driving method of the imaging apparatus that can obtain a high-quality image by reducing the effect of the voltage variation of the floating diffusion region.

According to one aspect of the present invention, a driving method of an imaging apparatus is provided, wherein the imaging apparatus comprises: a plurality of pixel units arranged in a matrix composed of a plurality of columns and a plurality of rows, wherein the plurality of pixel units includes a first pixel unit and a second pixel unit arranged in different rows; a plurality of first output lines, each connected to the plurality of pixel units arranged in a corresponding column of the plurality of columns; a plurality of signal holding units configured to respectively hold signals of the plurality of first output lines; a plurality of read out units configured to read out, to a second output line, signals of the signal holding units; and a scanning circuit configured to control the plurality of read out units, wherein each of the plurality of pixel units has: a plurality of photoelectric conversion portions configured to generate a signal by a photoelectric conversion; an amplifying portion configured to amplify a signal from the photoelectric conversion portion and output an amplified signal to the first output line; a plurality of transfer portions configured to respectively transfer signals of the plurality of photoelectric conversion portions to an input node of the amplifying portion; and a reset portion configured to selectively apply, to the input node, a selection reset voltage and a non-selection reset voltage, and wherein the driving method comprises: a first step of applying, by the reset portion of the first pixel unit, the selection reset voltage to the input node of the amplifying portion of the first pixel unit; after the first step, a second step of transferring a signal of one of the plurality of photoelectric conversion portions of the first pixel unit to the input node of the amplifying portion of the first pixel unit by corresponding one of the plurality of transfer portions of the first pixel unit, and of outputting an amplified signal to the first output line by the amplifying portion of the first pixel unit; after the second step, a third step of holding signals of the first output lines by the signal holding units; after the third step, a fourth step of sequentially reading out the signals of the holding units to the second output line by the plurality of read out units, wherein the scanning circuit controls the plurality of read out units sequentially; after the third step and before an end of the fourth step, a fifth step of applying the non-selection reset voltage to the input node of the amplifying portion of the first pixel unit by the reset portion of the first pixel unit, and of applying the selection reset voltage to the input node of the amplifying portion of the second pixel unit by the reset portion of the second pixel unit; and after the fourth step, a sixth step of transferring a signal of one of the plurality of photoelectric conversion portions of the second pixel unit to the input node of the amplifying portion of the second pixel unit by corresponding one of the plurality of transfer portions of the second pixel unit, and of outputting an amplified signal to the first output line by the amplifying portion of the second pixel unit.

According to a further aspect of the present invention, provided is a driving method of an imaging apparatus, wherein the imaging apparatus comprises: a plurality of pixel units arranged in a matrix composed of a plurality of columns and a plurality of rows, wherein the plurality of pixel units includes a first pixel unit and a second pixel unit arranged in different rows; a plurality of first output lines, each connected to the plurality of pixel units arranged in a corresponding column of the plurality of columns; a plurality of signal holding units configured to respectively hold signals of the plurality of first output lines; and a plurality of analog to digital conversion circuits, each configured to convert a signal of the signal holding unit into a digital signal, wherein each of the plurality of pixel units has: a plurality of photoelectric conversion portions configured to generate a signal by a photoelectric conversion; an amplifying portion configured to amplify a signal from the photoelectric conversion portion and output an amplified signal to the first output line; a plurality of transfer portions configured to respectively transfer signals of the plurality of photoelectric conversion portions to an input node of the amplifying portion; and a reset portion configured to selectively apply, to the input node, a selection reset voltage and a non-selection reset voltage, and wherein the driving method comprises: a first step of applying, by the reset portion of the first pixel unit, the selection reset voltage to the input node of the amplifying portion of the first pixel unit; after the first step, a second step of transferring a signal of one of the plurality of photoelectric conversion portions of the first pixel unit to the input node of the amplifying portion of the first pixel unit by corresponding one of the plurality of transfer portions of the first pixel unit, and of outputting an amplified signal to the first output line by the amplifying portion of the first pixel unit; after the second step, a third step of holding signals of the first output lines by the signal holding units; after the third step, a fourth step of converting a signal of the holding unit into a digital signal by the analog to digital conversion circuit; after the third step and before an end of the fourth step, a fifth step of applying the non-selection reset voltage to the input node of the amplifying portion of the first pixel unit by the reset portion of the first pixel unit, and of applying the selection reset voltage to the input node of the amplifying portion of the second pixel unit by the reset portion of the second pixel unit; and, after the fourth step, a sixth step of transferring a signal of one of the plurality of photoelectric conversion portions of the second pixel unit to the input node of the amplifying portion of the second pixel unit by corresponding one of the plurality of transfer portions of the second pixel unit, and of outputting an amplified signal to the first output line by the amplifying portion of the second pixel unit.

According to a still further aspect of the present invention, provided is a driving method of an imaging apparatus, wherein the imaging apparatus comprises a pixel unit and an output line, wherein the pixel unit includes: a plurality of photoelectric conversion portions configured to generate a signal by a photoelectric conversion; an amplifying portion configured to amplify a signal from the photoelectric conversion portion and output an amplified signal to the output line; a plurality of transfer switches configured to respectively transfer signals of the plurality of photoelectric conversion portions to an input node of the amplifying portion; and a reset switch configured to selectively apply, to the input node, a selection reset voltage and a non-selection reset voltage, wherein the driving method comprises: a first step of turning on the reset switch, whereby applying the selection reset voltage to the input node of the amplifying portion; after the first step, a second step of turning on a first transfer switch of the plurality of transfer switches, whereby transferring a signal of a first photoelectric conversion portion of the plurality of photoelectric conversion portions to the input node of the amplifying portion; after the second step, a third step of turning on the reset switch, whereby applying the selection reset voltage to the input node of the amplifying portion; and after the third step, a fourth step of turning on a second transfer switch of the plurality of transfer switches, whereby transferring a signal of a second photoelectric conversion portion of the plurality of photoelectric conversion portions to the input node of the amplifying portion, and wherein a first period from turning on the reset switch in the first step until turning on the first transfer switch in the second step is longer than a second period from turning on the reset switch in the third step until turning on the second transfer switch in the fourth step.

According to a still further aspect of the present invention, provided is a driving method of an imaging apparatus, wherein the imaging apparatus comprises: a pixel unit and an output line, wherein the pixel unit includes: a plurality of photoelectric conversion portions configured to generate a signal by a photoelectric conversion; an amplifying portion configured to amplify a signal from the photoelectric conversion portion and output an amplified signal to the output line; a plurality of transfer switches configured to respectively transfer signals of the plurality of photoelectric conversion portions to an input node of the amplifying portion; and a reset switch configured to selectively apply, to the input node, a selection reset voltage and non-selection reset voltage, wherein the driving method comprises: a first step of turning on the reset switch, whereby applying the selection reset voltage to the input node of the amplifying portion; after the first step, a second step of turning on a first transfer switch of the plurality of transfer switches, whereby transferring a signal of a first photoelectric conversion portion of the plurality of photoelectric conversion portions to the input node of the amplifying portion; after the second step, a third step of turning on the reset switch, whereby applying the selection reset voltage to the input node of the amplifying portion; after the third step, a fourth step of turning on a second transfer switch of the plurality of transfer switches, whereby transferring a signal of a second photoelectric conversion portion of the plurality of photoelectric conversion portions to the input node of the amplifying portion; and after the fourth step, a fifth step of turning on the reset switch, whereby applying the selection reset voltage to the input node of the amplifying portion, and wherein a third period from turning on the reset switch in the first step until turning on the reset switch in the third step is longer than a fourth period from turning on the reset switch in the third step until turning on the reset switch in the fifth step.

According to the present invention, a high-quality image can be obtained by reducing the effect of the voltage variation of the floating diffusion region.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
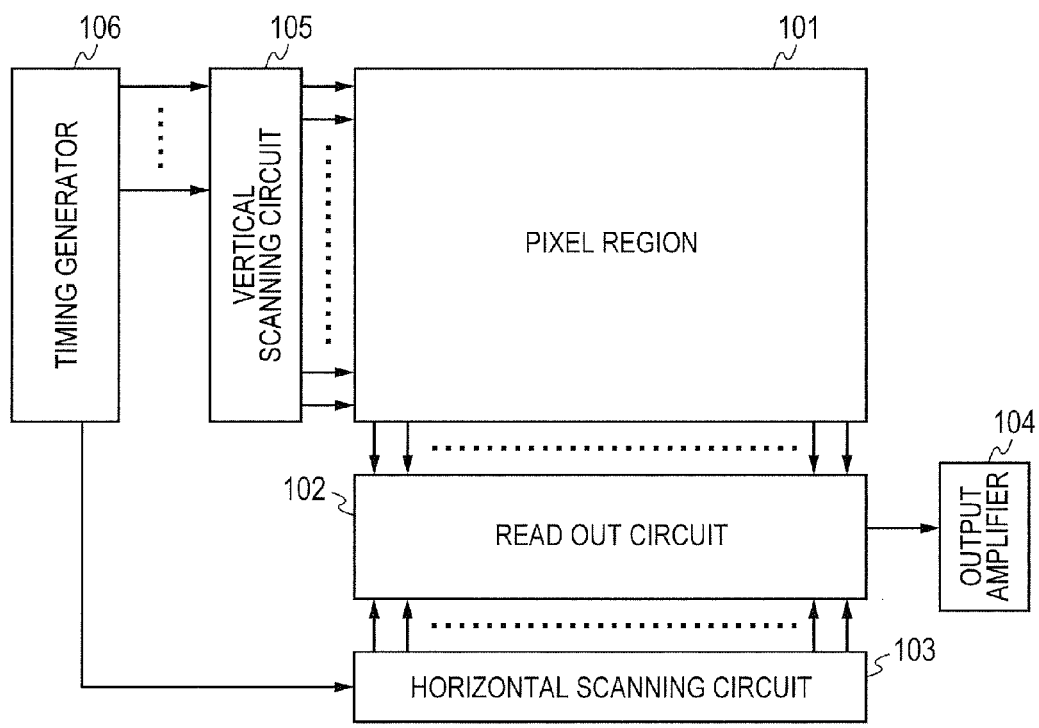
FIG. 1 is a block diagram of an imaging apparatus according to a first embodiment of the present invention.
Figure 2:
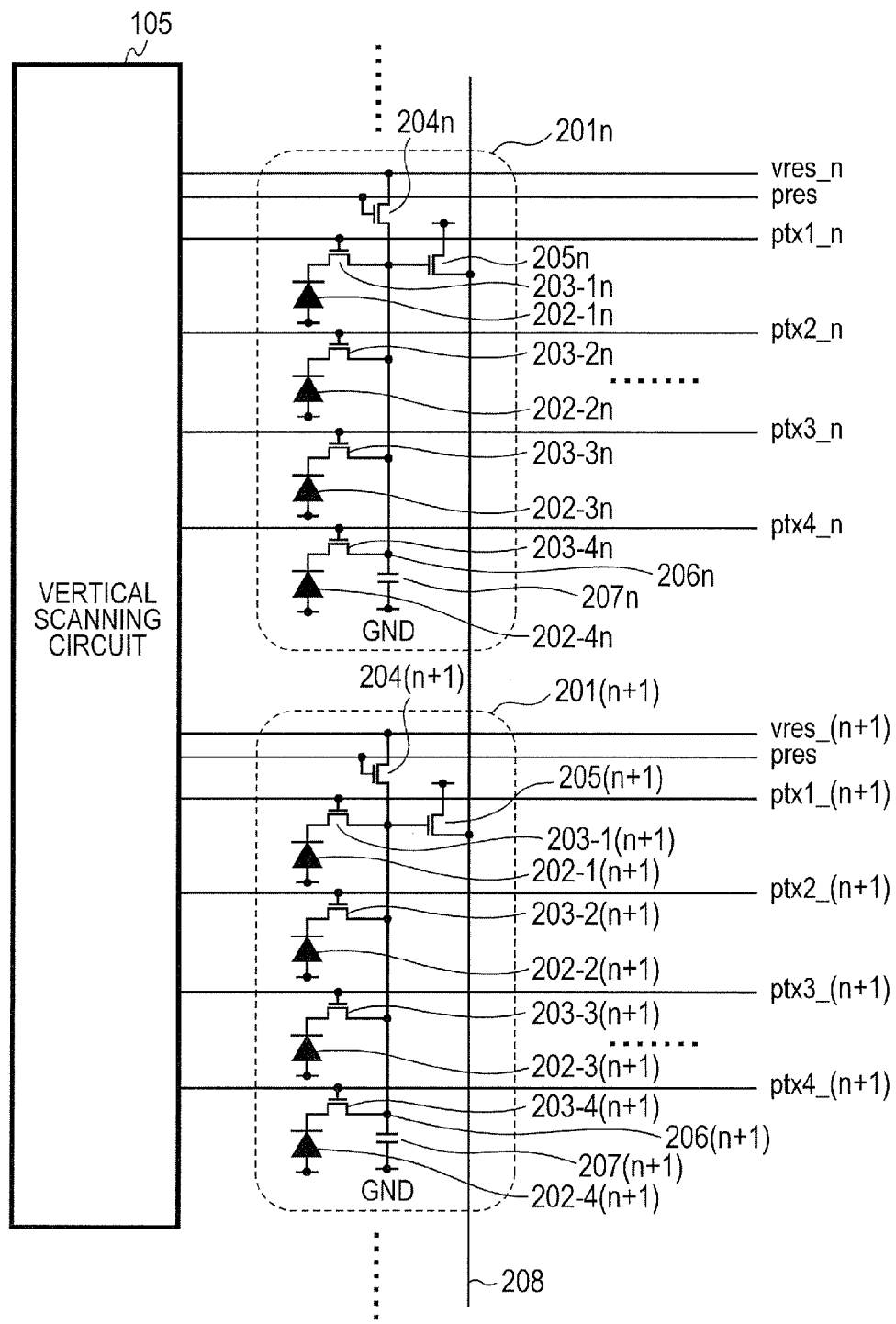
FIG. 2 is a connection diagram of a pixel unit and a vertical scanning circuit.

For the simplification, the illumination of an object is low in examples described in all embodiments of the present invention. FIG. 1 is a block diagram illustrating an example of configuration of an imaging apparatus according to a first embodiment of the present invention. FIG. 2 is a diagram illustrating a connection diagram of a pixel unit and a vertical scanning circuit according to the first embodiment of the present invention. A pixel region 101 of FIG. 1 includes a plurality of pixel units 201$n$, 201($n$+1), and the like illustrated in FIG. 2 arranged in a matrix. The pixel unit 201$n$ and the like include a plurality of pixels corresponding to a plurality of photodiodes 202-1$n$ to 202-4$n$ and the like. The pixel region 101 includes color filters (not illustrated) in a Bayer color array in each of the pixel units 201$n$ and the like. A read out circuit 102 reads out pixel signals of pixels in the pixel region 101, row by row. A horizontal scanning circuit 103 successively outputs, to an output amplifier 104, the row-by-row pixel signals read out by the read out circuit 102. A timing generator 106 generates a control pulse for reading out pixel signals and outputs the control pulse to a vertical scanning circuit 105 and the horizontal scanning circuit 103. The vertical scanning circuit 105 successively outputs, to the read out circuit 102, the pixel signals of the pixels in the pixel region 101 row by row based on the control pulse generated by the timing generator 106.

The plurality of pixel units 201$n$, 201($n$+1), and the like is arranged in a matrix in FIG. 2. A plurality of vertical output lines 208 is connected to each column of the plurality of pixel units 201$n$, 201($n$+1), and the like. The pixel unit 201$n$ includes four photodiodes 202-1$n$ to 202-4$n$ corresponding to four pixels. The pixel unit 201($n$+1) includes four photodiodes 202-1($n$+1) to 202-4($n$+1) corresponding to four pixels. A variable n denotes an arrangement number of a pixel unit in a vertical direction. A pixel unit after n is (n+1), and a pixel unit before n is (n−1). The vertical scanning circuit 105 performs vertical scan in each row of the pixel units (hereinafter, "pixel unit row"). The character n denotes a row number of the pixel units. Each pixel unit row includes four pixel rows. The pixel unit 201$n$ includes a plurality of photodiodes 202-1$n$, 202-2$n$, 202-3$n$, and 202-4$n$ and a plurality of transfer MOS transistors (transistor switches) 203-1$n$, 203-2$n$, 203-3$n$, and 203-4$n$. The pixel unit 201$n$ further includes one reset MOS transistor (reset switch) 204$n$, one floating diffusion region (FD) 206$n$, and one amplification MOS transistor (amplification transistor) 205$n$. The photodiodes (photoelectric conversion portions) 202-1$n$, 202-2$n$, 202-3$n$, and 202-4$n$ generate pixel signals (signal charges) by photoelectric conversion. The FD 206$n$ accumulates the signals. The transfer MOS transistors 203-1$n$, 203-2$n$, 203-3$n$, and 203-4$n$ transfer the signals photoelectrically converted by the photodiodes 202-1$n$ to 202-4$n$ to the FD 206$n$, respectively. Sources of the transfer MOS transistors 203-1$n$ to 203-4$n$ and a source of the reset MOS transistor 204$n$ are connected by the floating diffusion region (FD) 206$n$. The FD 206$n$ is connected to a gate of the amplification MOS transistor 205. The amplification MOS transistor 205$n$ amplifies a signal of the FD 206$n$ and outputs the signal to the vertical output line 208. Therefore, the FD 206$n$ forms an input node of the amplification portion. The vertical scanning circuit 105 outputs one of a selection reset voltage vresh and a non-selection reset voltage vresl as a reset power supply voltage vres_n. The reset MOS transistor 204$n$ applies, to the FD 206$n$, one of the selection reset voltage vresh and the non-selection reset voltage vresl as the reset power supply voltage vres_n. In the present embodiment, four sets of the photodiodes 202-1$n$ to 202-4$n$ and the transfer MOS transistor 203-1$n$ to 203-4$n$ share one floating diffusion region 206$n$. A source of the amplification MOS transistor 205$n$ is connected to the vertical output line 208. A parasitic capacitance 207$n$ is formed between the FD 206$n$ and a reference potential node (ground potential node) GND.

As illustrated in FIG. 2, the plurality of pixel units 201$n$, 201($n$+1), and the like is connected to one vertical output line 208. More specifically, signals from the photodiodes 202-1$n$ to 202-4$n$ and 202-1($n$+1) to 202-4($n$+1) of the plurality of pixels included in the plurality of pixel units 201$n$ and 201($n$+1) are output to one vertical output line 208. Although only the pixel units of one column are illustrated in FIG. 2, pixel units of a plurality of columns are actually arranged. One vertical output line 208 is arranged for the pixel units of each column.

A method of selecting a pixel unit from which a signal will be output among the plurality of pixel units connected to one vertical output line 208 will be described. In the present embodiment, a bias state of the amplification MOS transistors 205$n$ and 205($n$+1) included in the pixel units 201$n$ and 201($n$+1) is controlled to select a pixel. Specifically, voltages of the FDs 206$n$ and 206($n$+1) as inputs of the amplification MOS transistors 205$n$ and 205($n$+1) are controlled. For example, a voltage for setting the amplification MOS transistor 205$n$ to an inactive state (off state) can be supplied to the FD 206$n$ to set the pixel unit 201$n$ to "non-selected". On the other hand, a voltage for setting the amplification MOS transistor 205($n$+1) to an active state (on state) can be supplied to the FD 206($n$+1) to select the pixel unit 201($n$+1). The opposite, needless to say, is also possible.

The voltage supplied to the FD 206$n$ will be described. For example, if the amplification MOS transistor 205$n$ is an N-channel type, the selection reset voltage vresh can be supplied to the FD 206$n$ as the power supply voltage vres_n to select the pixel of the pixel unit 201$n$. In this case, the amplification MOS transistor 205$n$ is in the active state. On the other hand, the non-selection reset voltage vresl lower than the selection reset voltage vresh of the FD 206$n$ of the selected pixel unit 201$n$ can be supplied to the FD 206($n$+1) as the power supply voltage vres_n to set the pixel unit 201($n$+1) to "non-selected". In this case, the amplification MOS transistor 205($n$+1) is in the inactive state. A signal charge may be transferred to the FD 206$n$ of the selected pixel unit 201$n$, and the voltage of the FD 206$n$ may be reduced from the selection reset voltage vresh. Therefore, vresl may be set as a voltage lower than the reduced voltage of the FD 206$n$. Conversely, vresl may be set higher than the reduced voltage of the FD 206$n$. When vresl is set higher than the reduced voltage of the FD 206$n$, the amplification MOS transistor of the non-selected pixel may have a function of clipping the voltage of the vertical output line 208.

Figure 3:
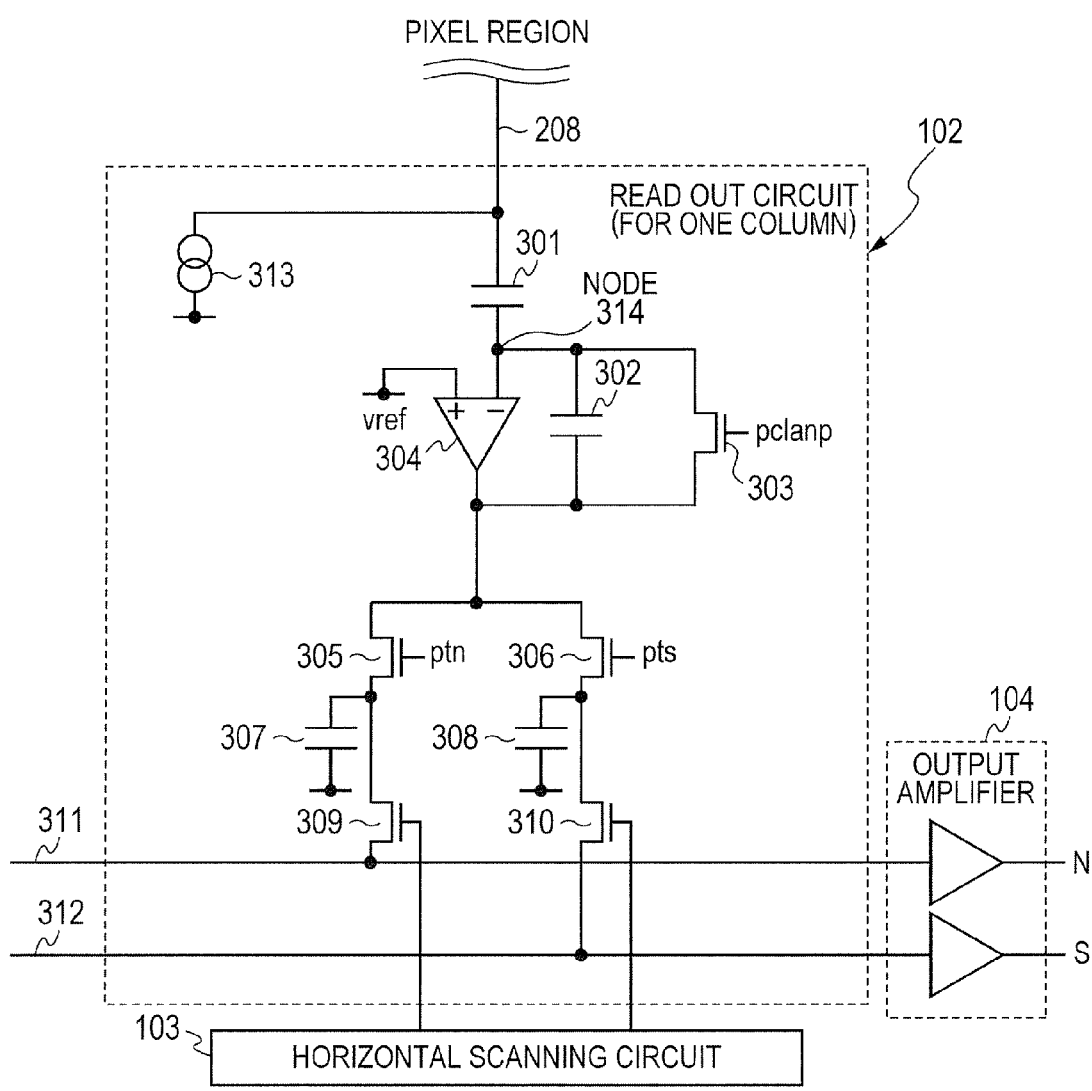
FIG. 3 is an explanatory diagram of a read out circuit, an output amplifier, and a horizontal scanning circuit of FIG. 1.

FIG. 3 is a detailed explanatory diagram of the read out circuit 102, the output amplifier 104, and the horizontal scanning circuit 103 of FIG. 1. A current source 313 is connected to the vertical output line 208 and is a current source for determining a potential of the vertical output line 208 based on a gate potential of the amplification MOS transistor 205$n$. The amplification MOS transistor 205$n$ and the current source 313 form a source follower circuit. A clamp capacitor 301 is a capacity for clamping the potential of the vertical output line 208 when a switch 303 for resetting a column amplifier 304 is turned on. A feedback capacitor 302 is a capacity for determining a gain by comparison with the clamp capacitor 301. A signal holding capacitor 307 and a signal holding capacitor 308 are capacities for holding the signals of the vertical output line 208. A sampling switch 305 writes an N signal of the vertical output line 208 in the signal holding capacitor 307 according to a pulse ptn. A sampling switch 306 writes an S signal of the vertical output line 208 in the signal holding capacitor 308 according to a pulse pts. A read out switch 309 reads out a signal of the signal holding capacitor 307 to a horizontal common line 311. A read out switch 310 reads out a signal of the signal holding capacitor 308 to a horizontal common line 312. The horizontal scanning circuit 103 controls the read out switches 309 and 310 to horizontally transfer the signals of the plurality of signal holding capacitors 307 and 308 to the horizontal common lines 311 and 312, respectively. The output amplifier 104 amplifies and outputs signals of the horizontal common lines 311 and 312. The output amplifier 104 may output a difference between the signals of the horizontal common lines 311 and 312. The read out circuit 102 is arranged for each of the plurality of vertical output lines 208.

The signal holding capacitor 307 is a signal holding capacitor for holding a reset level (N signal) of the FD 206n amplified by the column amplifier 304 after turning on the switch 305. The charges photoelectrically converted by the photodiodes 202-1n to 202-4n are transferred to the FD 206n through the transfer MOS transistors 203-1n to 203-4n, respectively. The column amplifier 304 amplifies the signal level (S signal) of the FD 206n, and the switch 306 is turned on to hold the signal level in the signal holding capacitor 308. The horizontal common line 311 is for the N signal, and the horizontal common line 312 is for the S signal. The horizontal scanning circuit 103 successively turns on the switches 309 and 310 to horizontally transfer the signals held in the signal holding capacitors 307 and 308 to the horizontal common lines 311 and 312, respectively, and the signals are output through the output amplifier 104. In the scan of the row of the pixel unit 201n, a pixel signal read out period denotes a period from an end of the previous horizontal transfer to a start of the next horizontal transfer. A horizontal transfer period denotes a period from the transfer of the signals from the signal holding capacitors 307 to 308 to the horizontal common lines 311 and 312 to the output of the signals through the output amplifier 104. Specifically, the period is from when one of the switches 309 and 310 of the firstly read out column is turned on to when the signal of the lastly read out column is output through the output amplifier 104.

Figure 4:
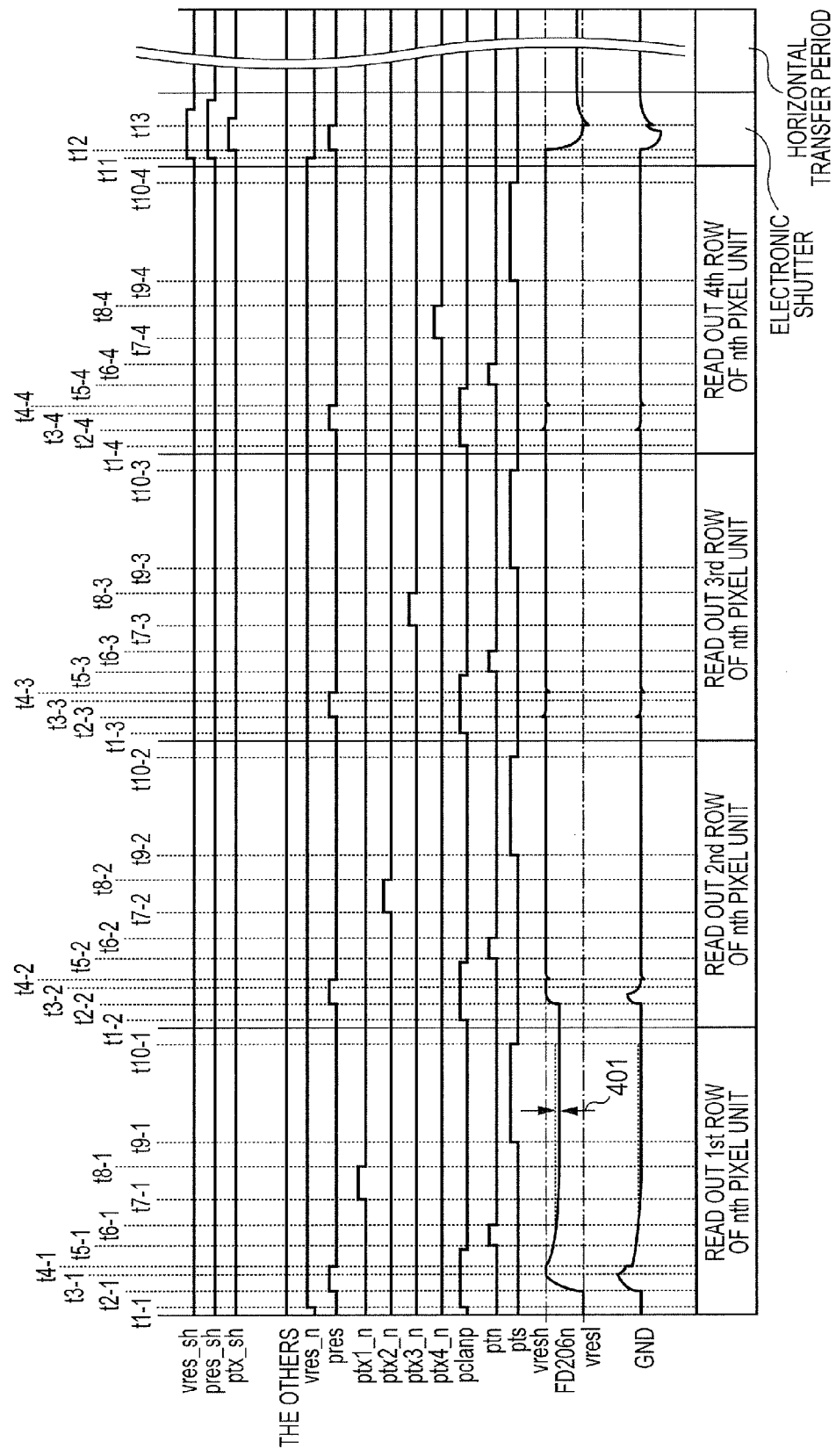
FIG. 4 is a variation schematic diagram of pixel signal read out timing and an FD potential.

A mechanism of generation of a row difference between pixels that share the FD 206n in the drive of the photodiodes 202-1n to 202-4n of the sharing pixels will be described. FIG. 4 illustrates pixel signal read out timing of the row of the pixel unit 201n and variation in the potential of the FD 206n based on a driving method of the imaging apparatus in a comparison example. In FIG. 4, time is written as t1-x. Numbers allocated to a plurality of photodiodes for which the charges are transferred to the common FD 206n are assigned to x. In the present embodiment, four pixels share one FD 206n, and x is 1 to 4. Signals vres_sh, pres_sh, and ptx_sh are pulses for electronic shutter. "THE OTHERS" and a signal vres_n denote power supply voltages of the reset transistor 204n. GND denotes a potential of the reference potential node.

The reset power supply voltage vres_n is a pulse supplied to a drain of the reset transistor 204n, and the voltage changes to one of the selection reset voltage vresh and the non-selection reset voltage vresl. The selection reset voltage vresh is a voltage higher than the non-selection reset voltage vresl. A reset pulse pres is a pulse applied to gates of the reset transistors 204n, 204(n+1), and the like. "THE OTHERS" denotes a power supply voltage supplied to a drain of a reset transistor of a pixel unit other than the pixel unit 201n. The pixel unit other than the pixel unit 201n is "non-selected". Therefore, the voltage of "THE OTHERS" is the non-selection reset voltage vresl.

Transfer pulses ptx1_n to ptx4_n are pulses applied to gates of the transfer transistors 203-1n to 203-4n, respectively. A pulse pclanp is a pulse applied to the column amplifier reset switch 303. The pulse ptn is applied to the switch 305, and the pulse pts is applied to the switch 306.

The pulses vres_sh, pres_sh, and ptx_sh are drive pulses for electronic shutter. The pulse vres_sh is a reset power supply control pulse of a shutter row, and one of the selection reset voltage vresh and the non-selection reset voltage vresl is supplied to the drain of the reset transistor. The pulse pres_sh is applied to the gate of the reset transistor of the shutter row. The pulse ptx_sh is a control signal applied to the gate of the transfer transistor of the shutter row. The electronic shutter is not essential in the present embodiment and will not be described.

At a time t1-1, the power supply voltage vres_n of the row of the pixel unit 201n to be read out is changed from the non-selection reset voltage vresl to the selection reset voltage vresh. The pulse pclanp is switched to the high level, and a node 314 and the feedback capacity 302 are reset to a reference voltage vref. The row of the pixel unit to be read out is the row of the pixel unit 201n described in FIG. 2.

At a time t2-1, the reset pulse pres is switched to the high level, and the selection reset voltage vresh is written in the FD 206n of the pixel unit 201n as the power supply voltage vres_n. If the reset pulse pres can be applied to all pixel unit rows, the non-selection reset voltage vresl can be written at this timing in the FD of the pixel unit row that will not be read out. There is no problem if the reset pulse pres is not written in all pixel unit rows at the same time. In this case, a time for setting the non-selection reset voltage vresl to the FD of the pixel unit row that will not be read out can be arranged. Before the photodiode 202-1n is read out, i.e. when a row other than the row of the pixel unit 201n is read, the potential of the FD 206n is set to the non-selection reset voltage vresl. In this way, the pixel unit 201n is set to a non-selected state. Therefore, if the pixel unit 201n is set to a selected state at the time t2-1, the potential of the FD 206n is changed by amplitude of (vresh-vreshl). At this time, the FD 206n is coupled to the reference potential node GND by the parasitic capacitance 207n. Therefore, the potential of the reference potential node GND is also changed by that amount.

At a time t3-1, the potential of the FD 206n becomes constant at the selection reset voltage vresh. The potential of the reference potential node GND tries to return to the original potential. At a time t4-1, the reset pulse pres is switched to a low level, the reset transistor 204n is turned off, and the FD 206n floats. Since the FD 206n floats at the time t4-1, the potential of the FD 206n is changed following the movement of the potential of the reference potential node GND trying to return to the original potential. A converging speed of the reference potential node GND is substantially controlled by a time constant determined by a parasitic resistance and a parasitic capacitance that exist at wiring of the reference potential node GND. Therefore, the greater the number of arrays of the pixel units, the longer the convergence time.

At a time t5-1, the pulse ptn is switched to the high level, and an N level is written in the signal holding capacitor 307. At a time t6-1, the pulse ptn is switched to the low level, and the writing of the N level in the signal holding capacitor 307 is finished. At a time t7-1, the pulse ptx1_n is switched to the high level, and the transfer transistor 203-1n is turned on. At a time t8-1, the pulse ptx1_n is switched to the low level, and the transfer transistor 203-1n is turned off. Since the illumination of the object is low here, the potential variation of the FD 206n at the transfer is so small that the potential variation can be ignored. At a time t9-1, the pulse pts is switched to the high level, and writing of the S signal of the photodiode 202-1n in the signal holding capacitor 308 is started. At a time t10-1, the pulse pts is switched to the low level, and writing of the S signal in the signal holding capacitor 308 is finished.

As in the drive at the times t1-1 to t10-1, the photodiode 202-2n of a second row in the pixel unit 201n is read out at times t1-2 to t10-2 based on a transfer pulse ptx2_n. Similarly, the photodiode 202-3n of a third row in the pixel unit 201n is read out at times t1-3 to t10-3 based on a transfer pulse ptx3_n. Similarly, the photodiode 202-4n of a fourth row in the pixel unit 201n is read out at times t1-4 to t10-4 based on a transfer pulse ptx4_n.

At a time t11, the power supply voltage vres_n is switched to the non-selection reset voltage vresl. At a time t12, the reset pulse pres is switched to the high level, the reset MOS transistor 204n is turned on, and the potential of the FD 206n is set to the non-selection reset voltage vresl. In this way, the row of the pixel unit 201n is set to the non-selected state again. At a time t13, the reset pulse pres is switched to the low level, and the reset transistor 204n is turned off. At this timing, an electronic shutter operation is performed based on the pulses vres_sh, pres_sh, and ptx_sh. A horizontal transfer period follows.

In the comparison example of FIG. 4, when the pixel unit 201n is set to "non-selected" at the time t13, the row of the pixel unit 201(n+1) as the next read out row remains "non-selected". After the end of the horizontal transfer period of the pixel unit 201n, the drive of the times t1-1 to t10-1, the times t1-2 to t10-2, the times t1-3 to t10-3, the times t1-4 to t10-4, and the times t11 to t13 is performed for the pixel unit 201(n+1). Therefore, an operation of selecting the pixel unit 201(n+1) is performed (times t1-1 to t4-1) after the end of the horizontal transfer period of the pixel unit 201n.

The variations in the FD potential when the signals of the pixels are read out will be compared. The potential of the FD 206n greatly changes as described above at the time t2-1 for resetting the FD 206n before the photodiode 202-1n is read out. On the other hand, at times t2-2, t2-3, and t2-4 for resetting the FD 206n before the photodiodes 202-2n, 202-3n, and 202-4n are read out, the potential of the FD 206n does not change at large amplitude, unlike at the time t2-1. As described, before the photodiode 202-1n is read out, i.e. when a row other than the row of the pixel unit 201n is read, the potential of the FD 206n is set to the non-selection reset voltage vresl at the time of non-selection. On the other hand, the photodiode 202-1n is already read out when the photodiodes 202-2n, 202-3n, and 202-4n are read out. Therefore, the FD 206n is at a high potential corresponding to the output of the previously read out pixel, instead of at the non-selection reset voltage vresl. Particularly, the potential of the FD is at a high potential close to the reset voltage vresh when the illumination is low.

Based on the time of the change in the potential of the FD 206n, the potential of the reference potential node GND at a time y can be expressed by the following Expression (1). In Expression (1), A denotes amplitude of the FD 206n, R denotes a resistance component of the reference potential node GND, and C denotes a capacity component of the reference potential node GND.

$$A \cdot \exp(-y/RC) \quad (1)$$

The smaller the amplitude A, the smaller the deviation from the reference potential at the time y. The amplitude A of the FD 206n is greater at least when the photodiode 202-1n is read out than when the photodiodes 202-2n, 202-3n, and 202-4n are read out. For example, the amplitude A of Expression (1) is more than four times greater. Therefore, a potential difference 401 of the FD 206n at the times t6-1 and t10-1 is more than four times greater than the potential difference of the FD 206n at times t6-x and t10-x (x=2 to 4). Therefore, more than four times of false signals are generated when the signal of the photodiode 202-1n is read compared to when the photodiodes 202-2n to 202-4n of other rows are read. If the potential of the reference potential node GND varies between the times t6-1 and t10-1, the potential of the floating FD 206n also varies. Therefore, a false signal is generated when subtraction is performed between the N signal and S signal to obtain a signal. This leads to a row difference. When the photodiodes 202-1n to 202-4n of four pixels in the column direction share the FD 206n, color filters are arranged in a Bayer color array, and first pixels and third pixels have the same color. A row difference is generated in the same color. If a pixel difference is generated in the same color, a correction method becomes complicated in the system, and the load of the entire system increases. Therefore, the generation of the row difference in the same color can be particularly prevented.

Figure 5:
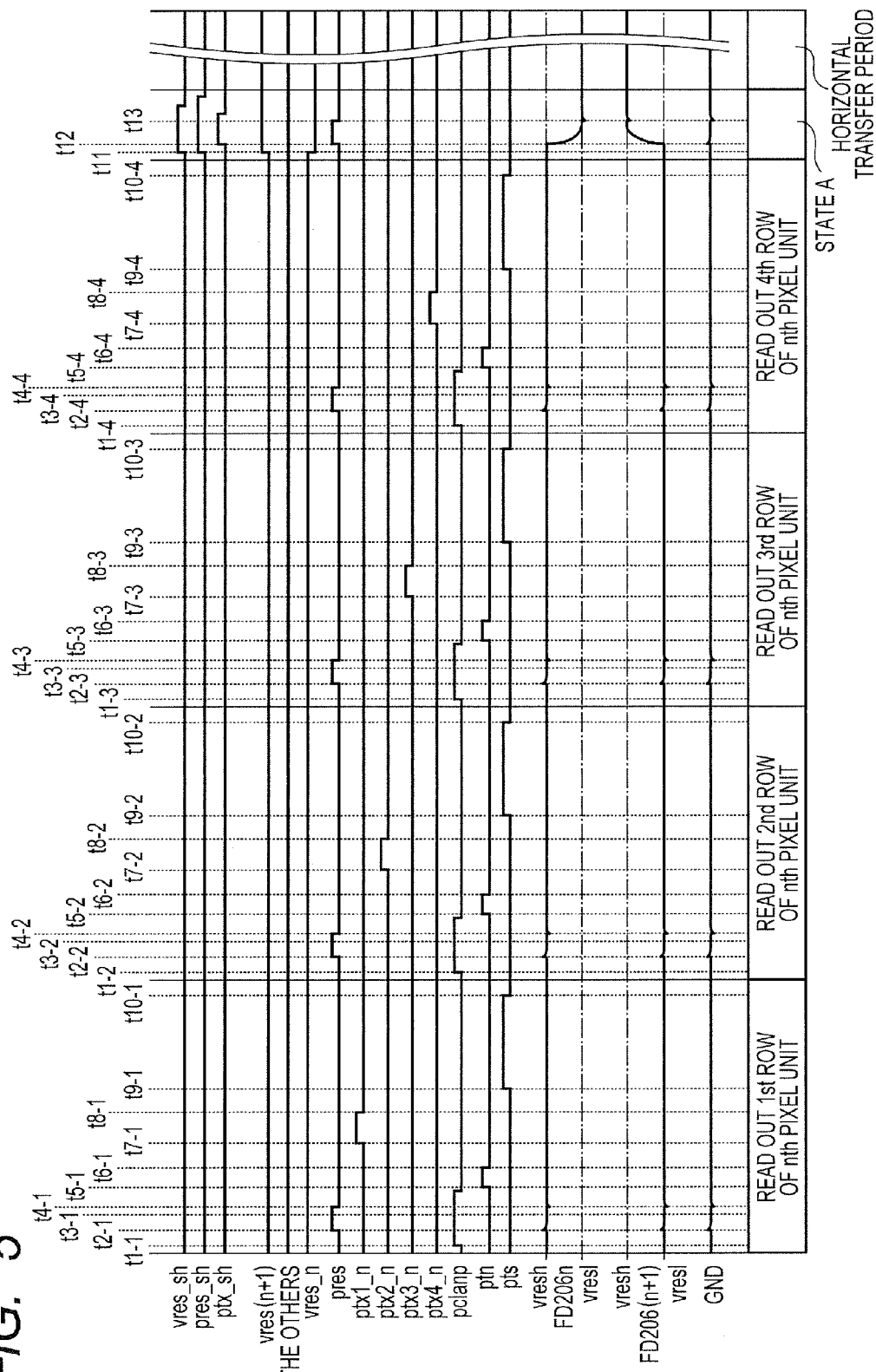
FIG. 5 is a variation schematic diagram of the pixel signal read out timing and the FD potential.

FIG. 5 illustrates timing and a potential variation of the FD indicating a driving method of the imaging apparatus according to the present embodiment. A reset power supply voltage vres(n+1) denotes a power supply pulse applied to the drain of the reset transistor 204(n+1) of the pixel unit 201(n+1). The same parts as in FIG. 4 are designated with the same reference numerals, and the detailed description will not be repeated. In FIG. 5, the reset power supply voltage vres_n and the voltage of the FD 206n are set to the selection reset voltage vresh from the beginning. This is because the operation of selecting the pixel unit 201n is performed before the end of the horizontal transfer period of the pixel unit read out before the pixel unit 201n. Therefore, the selection reset voltage vresh is supplied to the FD 205n before the end of the horizontal transfer period of the pixel unit read out before the pixel unit 201n.

At the time t11 in a state A before the horizontal transfer period of the row of the pixel unit 201n, the power supply voltage vres_(n+1) supplied to the drain of the reset transistor 204(n+1) of the pixel unit 201(n+1) to be read out next is changed to the selection reset voltage vresh. The power supply voltage vres_n supplied to the drain of the reset transistor 204n of the pixel unit 201n is changed to the non-selection reset voltage vresl.

At the time t12, the reset pulse pres is switched to the high level, and the reset transistors 204n and 204(n+1) are turned on. As a result, the potential of the FD 206(n+1) of the pixel unit 201(n+1) to be read out next is set to the selection reset voltage vresh, and the pixel unit 201(n+1) is switched to the selected state. On the other hand, the potential of the FD 206n of the pixel unit 201n is set to the non-selection reset voltage vresl, and the pixel unit 201n is switched to the non-selected state.

The potential variation of the reference potential node GND can be canceled by the movement of the FD 206(n+1) toward the selection reset voltage vresh and the movement of the FD 206(n+1) toward the non-selection reset voltage vresl. Although the timing of switching the FD 206n to the non-selection reset voltage vresl and the timing of switching the FD 206(n+1) to the selection reset voltage vresh are the same in the present embodiment, the timings may not be the same. The timings can be the same to allow cancelling the variation of the reference potential node GND.

As described, the FD 206(n+1) of the pixel unit 201(n+1) is set to the selection reset voltage vresh in advance, and the horizontal transfer period of the pixel unit 201n is provided before the photodiode 202-1(n+1) is read out. Therefore, the potential variation of the reference potential node GND is sufficiently converged when the pixel signal of the pixel unit 201(n+1) is read out. The amplitude of the FD 206(n+1) at the time t2-1 is also significantly small, and the amplitude is at least smaller than one quarter of that in FIG. 4. As a result, the present embodiment can suppress the generation of the false signal and suppress the generation of the row difference. The state of the potential of the FD 206(n+1) when the signal of the photodiode 202-1(n+1) of the first row is read out can be set close to the state of the potential of the FD 206(n+1) when the signals of the photodiodes 202-2(n+1) to 202-4(n+1) of the second and subsequent rows are read out. This can reduce the row difference. Thus, timing of setting the selection reset voltage vresh to the FD 206(n+1) of the pixel unit 201(n+1) will be described. The timing can be more than a period before, the period equivalent to a period from the selection reset time t2-2 of the FD when the second and subsequent pixels are read out to the time t10-2 at the end of the reading of the signal of the photodiode. If the selection reset voltage vresh is set to the FD 206(n+1) more than the period equivalent to the period before, the potential variation of the FD 206(n+1) when the signal of each row is read out can be reduced to about the same level when the pixel unit 201(n+1) is read out.

Setting the selection reset voltage vresh to the FD within the horizontal transfer period causes power supply variation, and noise may be added to the signal in the horizontal transfer. Therefore, the selection reset voltage vresh can be set to the FD 206(n+1) after the end of the reading out of the signals of all photodiodes 202-1n to 202-4n of the pixel unit 201n and before the horizontal transfer period as in the present embodiment. However, the selection operation of the pixel unit 201(n+1) may be performed in the horizontal transfer period of the pixel unit 201n.

An example of defining the pixel unit 201n as a first pixel unit and defining the pixel unit 201(n+1) as a second pixel unit will be described. The first pixel unit 201n and the second pixel unit 201(n+1) are arranged in different rows. The symbols n and n+1 indicate orders of reading out the signals, and the nth and (n+1)th pixel units may not be arranged adjacently. The first pixel unit 201n is read out first, and then the second pixel unit 201(n+1) is read out. The reading out of the second pixel unit 201(n+1) is the same as the reading out of the first pixel unit 201n of FIG. 5.

Reading out of the S signal of the last pixel of the first pixel unit 201n will be described. In a first step at times t2-4 to t4-4, the reset switch 204n of the first pixel unit 201n applies the selection reset voltage vresh to the FD 206n of the first pixel unit 201n.

In a second step at times t7-4 to t8-4 after the first step, the transfer switch 203-4n of the first pixel unit 201n transfers the signal of the photoelectric conversion portion 202-4n of the first pixel unit 201n to the FD 206n of the first pixel unit 201n. The amplification transfer 205n of the first pixel unit 201n amplifies the signal of the FD 206n of the first pixel unit 201n and outputs the signal to the vertical output line 208.

In a third step at times t9-4 to t10-4 after the second step, the sampling switch 306 writes the signal of the vertical output line 208 in the signal holding capacitor 308.

In a fourth step at the horizontal transfer period after the third step, the horizontal scanning circuit 103 horizontally transfers, to the horizontal common line 312, the signal based on the photoelectric conversion portion 202-4n of the first pixel unit 201n held in the signal holding capacitor 308.

In a fifth step at the times t12 to t13 after the third step and before the end of the horizontal transfer in the fourth step, the reset switch 204n of the first pixel unit 201n applies the non-selection reset voltage vresl to the FD 206n of the first pixel unit 201n. The reset switch 204(n+1) of the second pixel unit 201(n+1) applies the selection reset voltage vresh to the FD 206(n+1) of the second pixel unit 201(n+1). The fifth step can be performed after the third step and before the start of the horizontal transfer of the fourth step.

Reading out of the first pixel of the second pixel unit 201(n+1) will be described. In a sixth step at the times t2-1 to t4-1 after the fourth step, the reset switch 204(n+1) of the second pixel unit 201(n+1) applies the selection reset voltage vresh to the FD 206(n+1) of the second pixel unit 201(n+1).

After the sixth step, a seventh step at the times t7-1 to t8-1 is performed. In the seventh step, the transfer switch 203-1(n+1) of the second pixel unit 201(n+1) transfers the signal of the photoelectric conversion portion 202-1(n+1) of the second pixel unit 201(n+1) to the FD 206(n+1) of the second pixel unit 201(n+1). The amplification transistor 205(n+1) of the second pixel unit 201(n+1) amplifies the signal of the FD 206(n+1) of the second pixel unit 201(n+1) and outputs the signal to the vertical output line 208.

The period from the time t2-4 in the first step to the time t10-4 in the third step is defined as a first period, and the fifth step can be performed after the third period and more than the first period before the start of the sixth step.

In the present embodiment, the FD is selected and reset before a different pixel unit row is read out. Therefore, the present embodiment can be applied even if the number of pixels sharing one FD is changed. For example, the present embodiment can be applied to realize the same effect when, for example, six pixels or eight pixels share one FD. The present invention can be applied if the number of pixels sharing the FD is two or more.

In the present embodiment, the color filters are arranged in a Bayer color array. However, the arrangement of the color filters is not limited to the Bayer color array. A plurality of pixels sharing the FD may include color filters of the same color. Monochrome pixels without the color filters may be implemented, or a 3CCD that disperses the light before the light enters the imaging apparatus may be implemented.

Although the numbers of the N signal holding capacitors 307 and the S signal holding capacitors 308 in FIG. 3 need to be four if, for example, signals of four rows are read out in one pixel signal read out period, the numbers are one here for the simplification. For the same reason, the pulses ptn and pts are described as pulses of one sequence in FIGS. 4 and 5. The same applies to the following embodiments.

Second Embodiment

Figure 6:
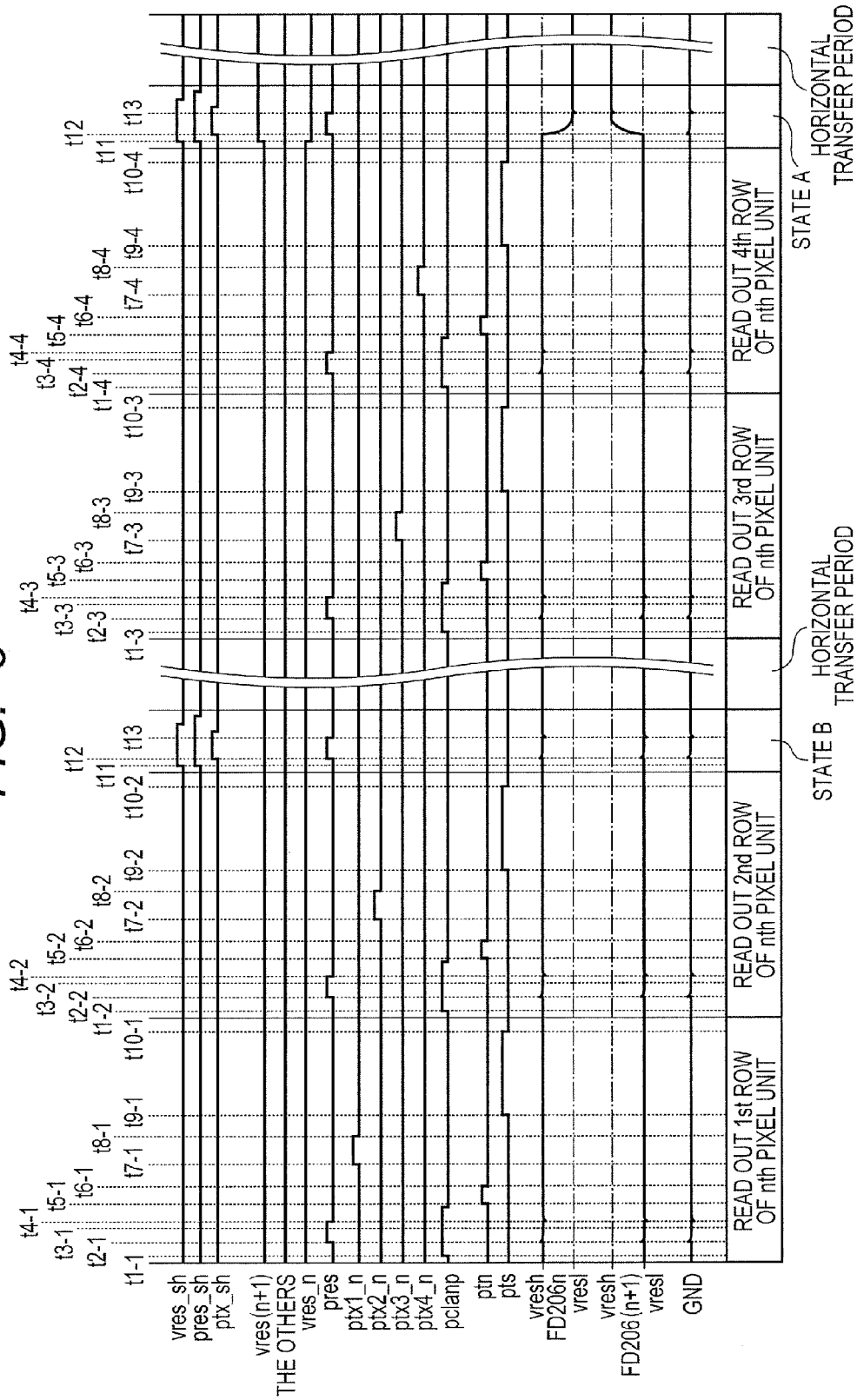
FIG. 6 is a variation schematic diagram of the pixel signal read out timing and the FD potential.

In a second embodiment of the present invention, the same imaging apparatus as in the first embodiment is used to perform the reading out at different timing. FIG. 6 illustrates timing and variation in the FD potential indicating a driving method of the imaging apparatus according to the second embodiment of the present invention. Differences between the present embodiment (FIG. 6) and the first embodiment (FIG. 5) will be described. At the times t1-1 to t10-1, the signal of the photodiode 202-1n of the first row of the pixel unit 201n is read out. At the times t1-2 to t10-2, the signal of the photodiode 202-2n of the second row is read out. A state B is executed at the times t11 to t13, and the first and second rows are horizontally transferred at the horizontal transfer period. After the end of the horizontal transfer, the signal of the photodiode 202-3n of the third row is read out at the times t1-3 to t10-3. The signal of the photodiode 202-4n of the fourth row is read out at the times t1-4 to t10-4, and the state A of the times t11 to t13 is executed. The third and fourth rows are horizontally transferred at the horizontal transfer period, and reading out of the row of the pixel unit 201(n+1) is started. The state B is a state of operating the electronic shutter. The state A denotes the same operation as in the first embodiment. The state A sets the FD 206(n+1) of the pixel unit 201(n+1) to the selection reset voltage vresh in advance, and the horizontal transfer period is provided before the photodiode 202-1 (n+1) is read out. Therefore, the potential of the reference potential node GND is sufficiently converged. The amplitude of the FD 206(n+1) at the time t2-1 is also significantly small, and the amplitude is at least smaller than one quarter of that in FIG. 4. This can suppress the generation of the false signal and suppress the generation of the row difference.

As described, the state B is a state that functions as timing of the electronic shutter. Unlike in the state A, the power supply voltage vres_n remains at the selection reset voltage vresh, and the power supply voltage vres_(n+1) remains at the non-selection reset voltage vresl. Therefore, the potentials of the FDs 206n and 206(n+1) do not change even if the reset pulse pres at the high level is applied. In this way, the potential of the FD is not unnecessarily charged or discharged when the pixel signals that share the same FD are read out. The potential variation of the reference potential node GND is suppressed, and the generation of the false signal is suppressed. The state B can be the same length as the length of the state A to always keep the accumulation time constant. For example, even if the read out start pixel is switched between a first-row start and a third-row start in each frame in the interlaced operation, the time from the end of the reading out of the pixel signal to the beginning of the horizontal transfer period does not change, and the accumulation time is not deviated.

In the present embodiment, the potential of the FD is selected and reset before a different pixel unit row is read out. Therefore, the present embodiment can be applied even if the number of pixels that share one FD is changed. For example, the present embodiment can be applied to realize the same effect when, for example, two pixels, four pixels, six pixels, or eight pixels share one FD.

Third Embodiment

Figure 7:
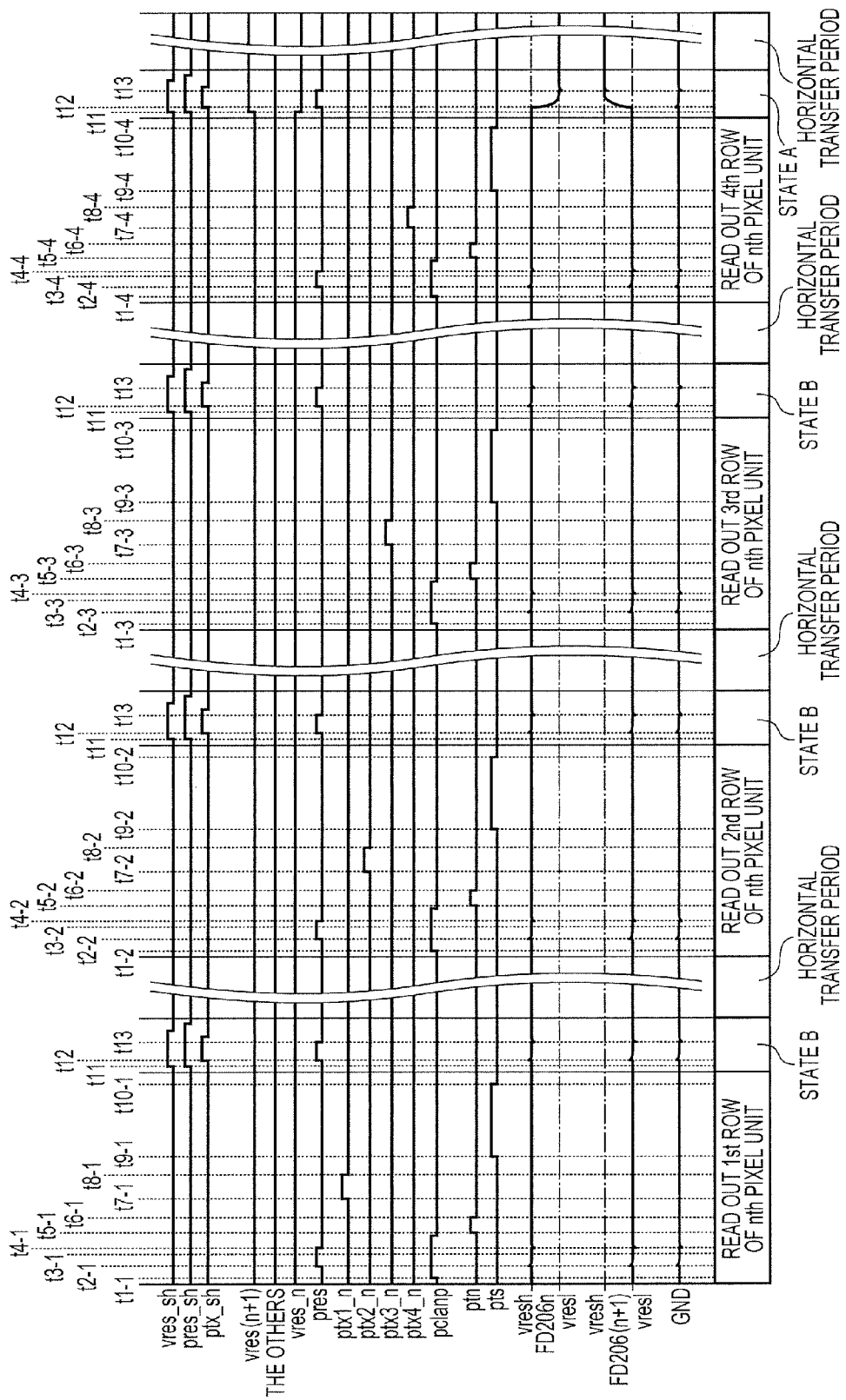
FIG. 7 is a variation schematic diagram of the pixel signal read out timing and the FD potential.

FIG. 7 illustrates timing and variation in the FD potential indicating a driving method of the imaging apparatus according to a third embodiment of the present invention. In the present embodiment, after the signal of the photodiode 202-1 of the first row of the pixel unit 201n is read out at the times t1-1 to t10-1, the state B of the times t11 to t13 is performed, and the first row is horizontally transferred at the horizontal transfer period. After the signal of the photodiode 202-2n of the second row of the pixel unit 201n is read out at the times t1-2 to t10-2, the state B is performed at the times t11 to t13, and the second row is horizontally transferred at the horizontal transfer period. After the signal of the photodiode 202-3n of the third row of the pixel unit 201n is read out at the times t1-3 to t10-3, the state B is performed at the times t11 to t13, and the third row is horizontally transferred at the horizontal transfer period. Lastly, after the signal of the photodiode 202-4n of the fourth row of the pixel unit 201n is read out at the times t1-4 to t10-4, the state A is performed at the times t11 to t13, and the fourth row is horizontally transferred at the horizontal transfer period. In this way, the pixel signal is read out in each row in the pixel unit 201n. The states A and B in the present embodiment are states for performing the same operations as in the first and second embodiments. Before the horizontal transfer period after the photodiode 202-4n of the fourth row of the pixel unit 201n is read, the FD 206(n+1) of the pixel unit 201(n+1) is set to the selection reset voltage vresh in advance in the state A at the times t11 to t13. The horizontal transfer period is provided before the photodiode 202-1(n+1) is read out, and the potential of the reference potential node GND is sufficiently converged. The amplitude of the FD 206(n+1) at the time t2-1 is also sufficiently small, and the amplitude is at least smaller than one quarter of that of FIG. 4. This can suppress the generation of the false signal and suppress the generation of the row difference.

An example of successively reading out the first to fourth rows in the pixel unit 201n has been described in the present embodiment. There is a pattern in which after the third row of the pixel unit 201n is read out, the first row of the pixel unit 201(n+1) is read out, then the fourth row of the pixel unit 201n is read out, and lastly, the second row of the pixel unit 201(n+1) is read out. Therefore, there is a pattern in which the pixels of the common FD are not successively read out. Even in this case, the switch between the states A and B can easily suppress the variation in the FD potential at the pixel signal read out period.

In the present embodiment, the potential of the FD is selected and reset before a different pixel unit row is read out. Therefore, the present embodiment can be applied even if the number of pixels that share one FD is changed. For example, the present embodiment can be applied to realize the same effect when one pixel, two pixels, three pixels, four pixels, five pixels, six pixels, seven pixels, or eight pixels share one FD.

Fourth Embodiment

Figure 8:
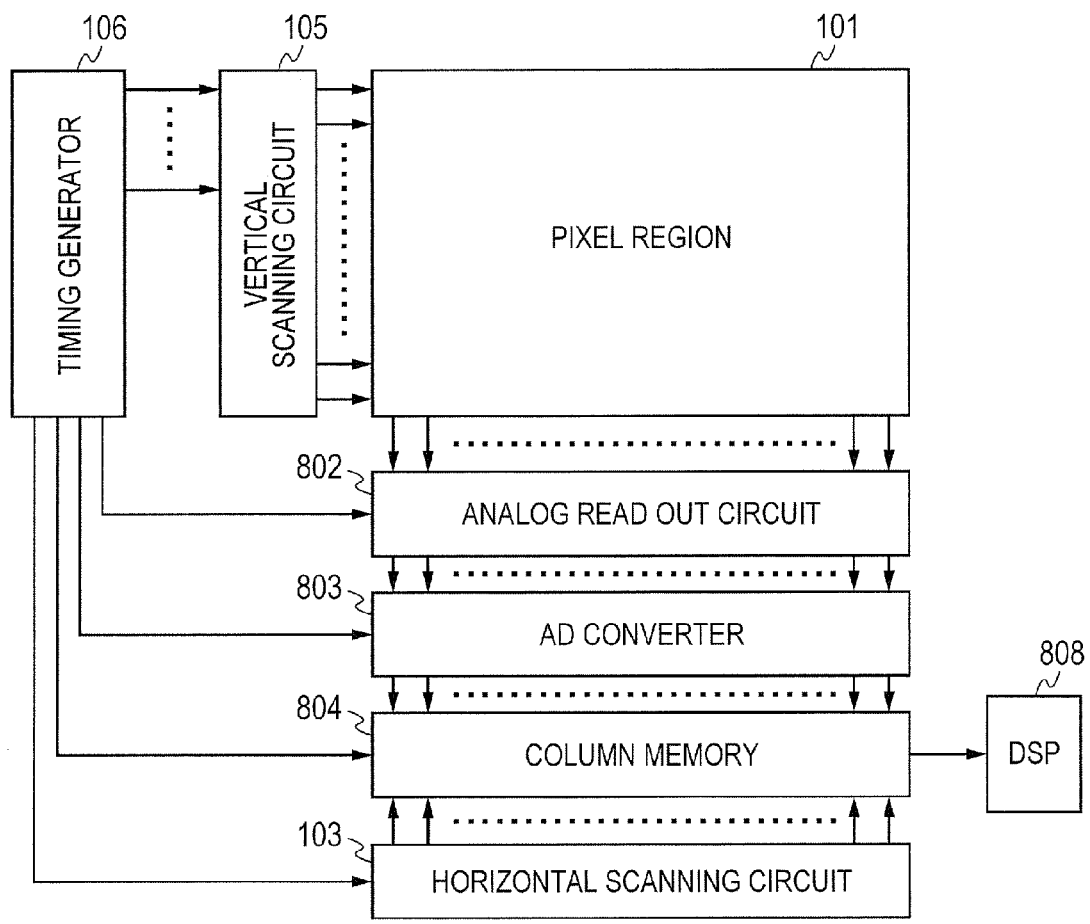
FIG. 8 is a block diagram of the imaging apparatus according to a fourth embodiment of the present invention.

FIG. 8 illustrates a block diagram of the imaging apparatus according to a fourth embodiment. The parts with the same functions as in FIG. 1 are designated with the same reference numerals, and the detailed description will not be repeated. The present embodiment is characterized in that a circuit for analog-digital conversion (AD conversion) is arranged in each column, and a selection operation of an nth pixel unit is performed in a period of AD conversion of a signal of the pixel unit read out before the nth pixel unit.

In FIG. 8, 101 denotes a pixel region. In the present embodiment, the structure of the pixel unit is the same as in the first embodiment (FIG. 2). An analog read out circuit 802 reads out an analog signal of each column. An AD converter 803 arranged in each column converts the read out analog signal to a digital signal. A memory 804 arranged in each column holds the signal after AD conversion. A digital signal processor (DSP) 808 processes and outputs the digital signal transferred from the column memory 804.

Figure 9:
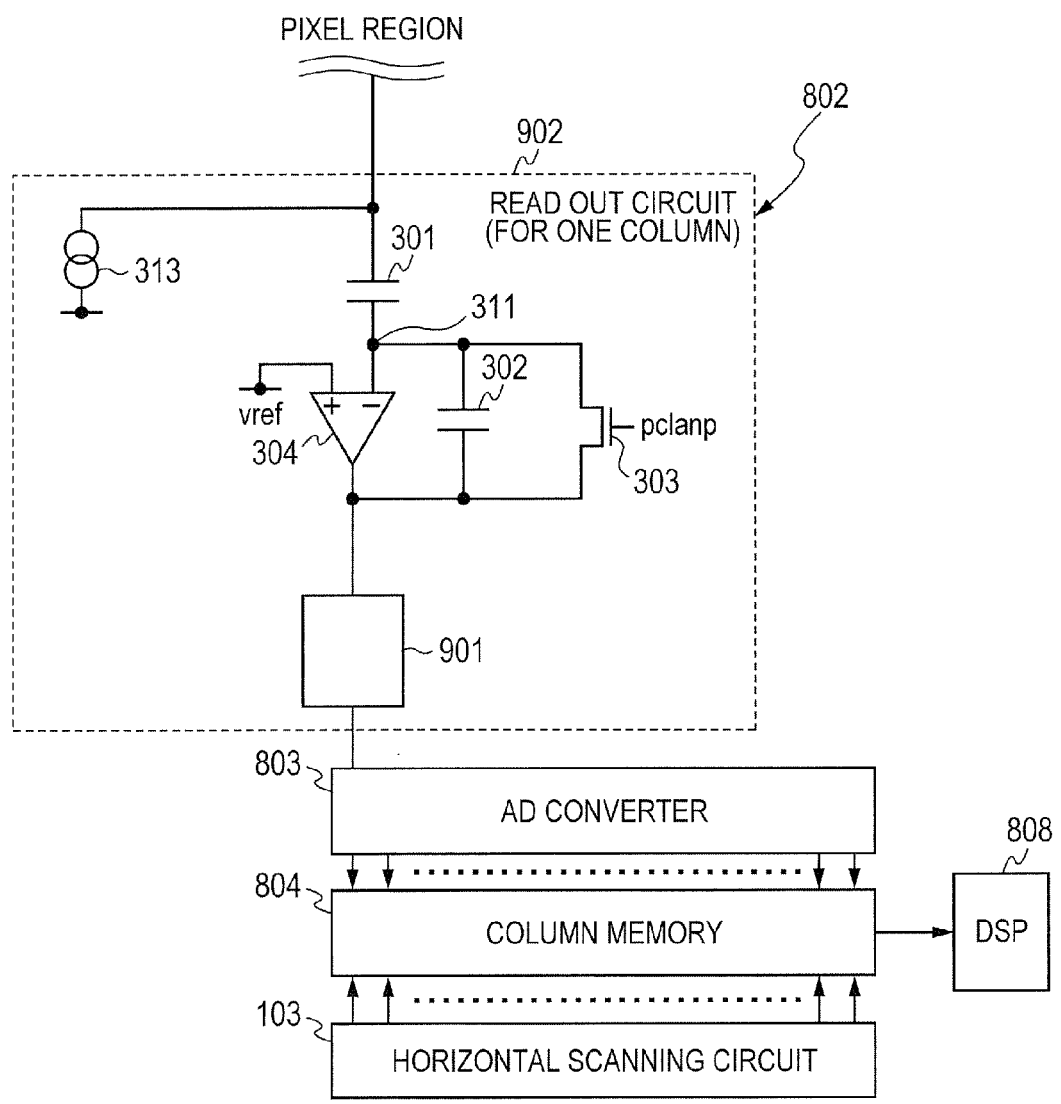
FIG. 9 is an explanatory diagram of an analog read out circuit.

FIG. 9 illustrates a detailed explanatory diagram of the analog read out circuit 802. A circuit 902 is for one column of the analog read out circuit 802 of FIG. 8. The parts with the same functions as in FIG. 3 are designated with the same reference numerals, and the detailed description will not be repeated. A signal holding unit 901 temporarily holds an output of the column amplifier 304, and the AD converter 803 converts the analog signal held in the signal holding unit 901 to a digital signal.

Figure 10:
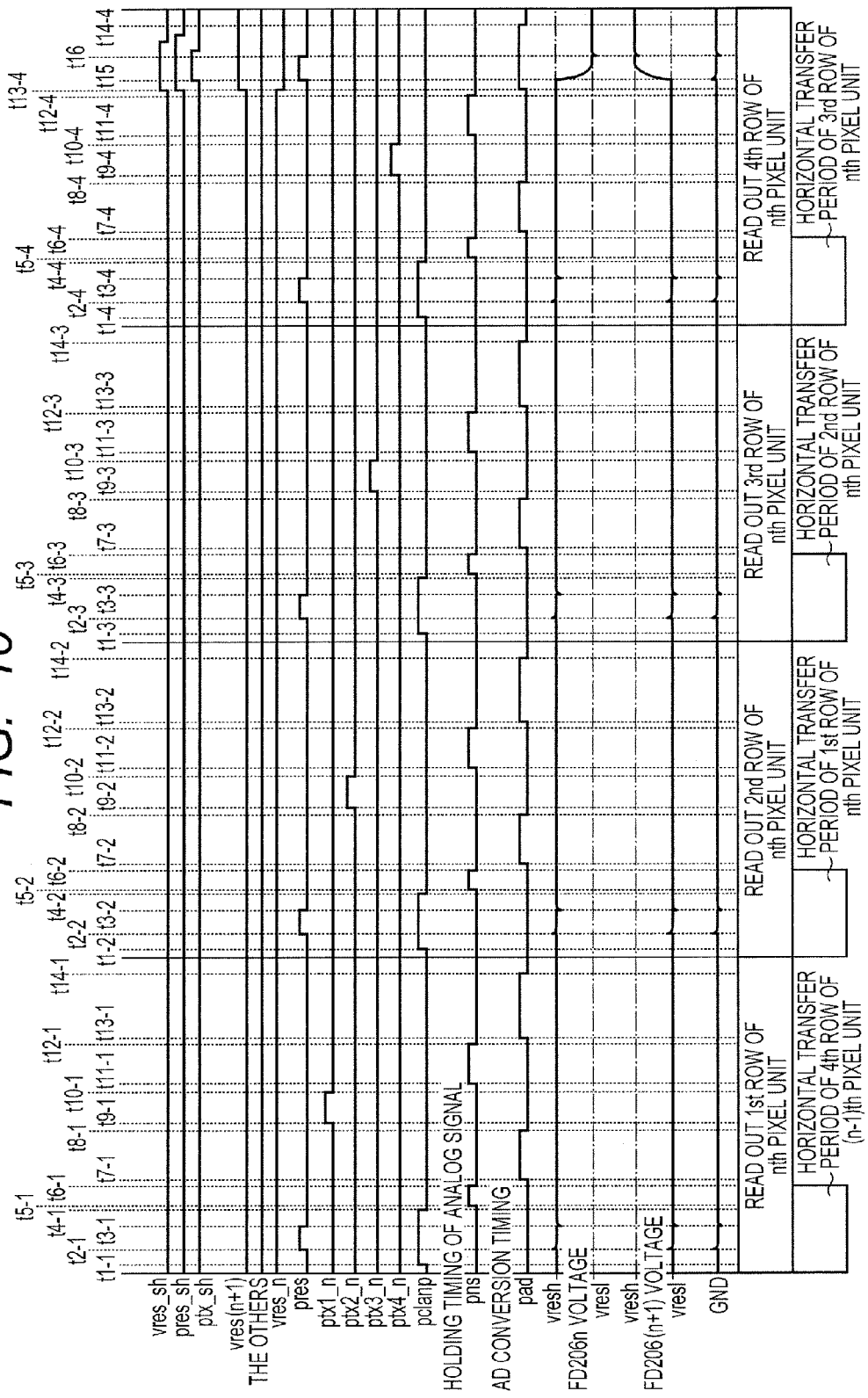
FIG. 10 is a variation schematic diagram of the pixel signal read out timing and the FD potential.

FIG. 10 illustrates pixel signal read out timing and variation in the FD potential according to the fourth embodiment. In FIG. 10, time is written as t1-$x$. Numbers allocated to a plurality of photodiodes for which the charges are transferred to the common FD 206n are assigned to $x$. In the present embodiment, four pixels share the FD 206n, and $x$ is 1 to 4. The pulse pns is a pulse for holding an analog signal in the signal holding unit 901. The output of the column amplifier 304 is imported to the charge holding unit 901 in a period in which the pulse pns is at the high level. A pulse pad is an AD conversion start pulse and is for converting the analog signal held in the signal holding unit 901 in the period of the high level to a digital signal.

At the time t1-1, the pulse pclanp is switched to the high level, and the node 314 and the feedback capacity 302 are reset to the reference level (vref). The pixel unit row read out here is 201n described in FIG. 2. At the time t2-1, the pulse pres is switched to the high level, and the selection reset voltage vresh is written in the FD 206n of the pixel unit row 201n. In this case, the selection reset voltage vresh is already written in the FD 206n of the pixel unit row 201n in a period of t15 to t16 when the fourth pixel of the pixel unit row 201(n−1) is read out, and the potential does not change much. At the time 3-1, the pulse pres is switched to the low level, and the FD 206n floats. At the time t4-1, the pulse pclanp is switched to the low level, and the reset of the node 314 and the feedback capacitor 302 is canceled. At the time t5-1, the pulse pns is switched to the high level, and the output (N signal) of the column amplifier 304 is written in the signal holding unit 901. At the time t6-1, pns is switched to Lo, and writing in the signal holding unit 901 is finished. AD conversion is applied to the analog signal (reset level of the FD 206n) held in the signal holding unit 901 at a period of the times t7-1 to 8-1 when pad is Hi, and the value is stored in the column memory 804. At the times t9-1 to t10-1, the pulse ptx is switched to the high level, and the charge photoelectrically converted by the PD 202-1n is transferred to the FD 206n. At the times t11-1 to t12-1, the pulse ptn is switched to the high level again, and the pixel signal amplified by the column amplifier 304 is held in the signal holding unit 901. At times t13-1 to t14-1, the AD converter 803 applies AD conversion to the pixel signal (S signal) held in the signal holding unit 901, and the value is stored in the column memory 804. The digital signal stored in the column memory is transferred to the DSP 808 before the next AD conversion timing and is output to the outside of the chip after signal processing.

The pixel signals are successively read out through the procedure. In the present embodiment, the pulse pres_n is switched to the high level at times t15 to t16 during AD conversion of the S signal of times t13-4 to t14-4 at read out timing of the fourth row of the pixel unit row 201n. In this case, the reset power supply voltage vres_n is switched to the non-selection reset voltage vresl, the non-selection reset voltage vresl is supplied to the FD 206n of the pixel unit 201n in which the reading out of the pixel signal is finished, and the pixel unit 201n is switched to "non-selected". At the same time as the switch of the pixel unit 201n to "non-selected", the selection reset voltage vresh is written in the FD 206(n+1) of the pixel unit row 201(n+1) to be read out next, and the pixel unit row 201(n+1) is set to a selected state.

If the non-selection operation of the pixel unit row 201n and the selection operation of the pixel unit row 201(n+1) are performed at the same time as in the present embodiment, the variation in the reference potential GND can be further suppressed, and the time before the pixel reset level of the pixel unit row 201(n+1) is read out can be further reduced.

In this way, resetting the FD of the pixel unit row to be read out next to vresh in advance can improve the asymmetry between the rows concerning the variation in the FD potential at the times t2-1 to t3-1 and can reduce the fixed pattern noise of the row period.

The embodiments are intended to illustrate examples for implementing the present invention and should not be construed as limiting the technical scope of the present invention. The present invention can be implemented in various forms without departing from the technical concept and main features of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-174970, filed Aug. 10, 2011, which is hereby incorporated by reference herein in its entirety.

What is claimed is:

1. A driving method of an imaging apparatus, wherein the imaging apparatus comprises:
a plurality of pixel units arranged in a matrix composed of a plurality of columns and a plurality of rows, wherein the plurality of pixel units includes a first pixel unit and a second pixel unit arranged in different rows;
a plurality of first output lines, each connected to the plurality of pixel units arranged in a corresponding column of the plurality of columns;
a plurality of signal holding units configured to respectively hold signals of the plurality of first output lines;
a plurality of read out units configured to read out, to a second output line, signals of the signal holding units; and
a scanning circuit configured to control the plurality of read out units, wherein
each of the plurality of pixel units has:
a plurality of photoelectric conversion portions configured to generate a signal by a photoelectric conversion;
an amplifying portion configured to amplify a signal from the photoelectric conversion portion and output an amplified signal to the first output line;
a plurality of transfer portions configured to respectively transfer signals of the plurality of photoelectric conversion portions to an input node of the amplifying portion; and
a reset portion configured to selectively apply, to the input node, a selection reset voltage and a non-selection reset voltage, and wherein
the driving method comprises:
a first step of applying, by the reset portion of the first pixel unit, the selection reset voltage to the input node of the amplifying portion of the first pixel unit;
after the first step, a second step of transferring a signal of one of the plurality of photoelectric conversion portions of the first pixel unit to the input node of the amplifying portion of the first pixel unit by corresponding one of the plurality of transfer portions of the first pixel unit, and of outputting an amplified signal to the first output line by the amplifying portion of the first pixel unit;
after the second step, a third step of holding signals of the first output lines by the signal holding units;
after the third step, a fourth step of sequentially reading out the signals of the holding units to the second output line by the plurality of read out units, wherein the scanning circuit controls the plurality of read out units sequentially;
after the third step and before an end of the fourth step, a fifth step of applying the non-selection reset voltage to the input node of the amplifying portion of the first pixel unit by the reset portion of the first pixel unit, and of simultaneously applying the selection reset voltage to the input node of the amplifying portion of the second pixel unit by the reset portion of the second pixel unit; and
after the fourth step, a sixth step of transferring a signal of one of the plurality of photoelectric conversion portions of the second pixel unit to the input node of the amplifying portion of the second pixel unit by corresponding one of the plurality of transfer portions of the second pixel unit, and of outputting an amplified signal to the first output line by the amplifying portion of the second pixel unit.

2. The driving method according to claim 1, further comprising, after the fourth step before the sixth step, a seventh step of applying the selection reset voltage to the input node of the amplifying portion of the second pixel unit by the reset portion of the second pixel unit.

3. The driving method according to claim 2, wherein
the fifth step is performed, after the third step and more than a period before a start of the seventh step, the period from when the first step is started until the third step ends.

4. The driving method according to claim 1, wherein,
the fifth step is performed after the third step and before a beginning of the fourth step.

5. The driving method according to claim 1, wherein,
the amplifying portion comprises an N-channel MOS transistor, and the selection reset voltage is higher than the non-selection reset voltage.

6. The driving method according to claim 1, further comprising a plurality of reset voltage lines, each connected to the plurality of pixel units arranged in a corresponding row of the plurality of rows,
wherein the reset portion configured to selectively apply, from the reset voltage line to the input node, a selection reset voltage and a non-selection reset voltage.

7. A driving method of an imaging apparatus, wherein the imaging apparatus comprises:
a plurality of pixel units arranged in a matrix composed of a plurality of columns and a plurality of rows, wherein the plurality of pixel units includes a first pixel unit and a second pixel unit arranged in different rows;
a plurality of first output lines, each connected to the plurality of pixel units arranged in a corresponding column of the plurality of columns;
a plurality of signal holding units configured to respectively hold signals of the plurality of first output lines; and
a plurality of analog to digital conversion circuits, each configured to convert a signal of the signal holding unit into a digital signal, wherein
each of the plurality of pixel units has:
a plurality of photoelectric conversion portions configured to generate a signal by a photoelectric conversion;
an amplifying portion configured to amplify a signal from the photoelectric conversion portion and output an amplified signal to the first output line;
a plurality of transfer portions configured to respectively transfer signals of the plurality of photoelectric conversion portions to an input node of the amplifying portion; and
a reset portion configured to selectively apply, to the input node, a selection reset voltage and a non-selection reset voltage, and wherein
the driving method comprises:
a first step of applying, by the reset portion of the first pixel unit, the selection reset voltage to the input node of the amplifying portion of the first pixel unit;
after the first step, a second step of transferring a signal of one of the plurality of photoelectric conversion portions of the first pixel unit to the input node of the amplifying portion of the first pixel unit by corresponding one of the plurality of transfer portions of the first pixel unit, and of outputting an amplified signal to the first output line by the amplifying portion of the first pixel unit;
after the second step, a third step of holding signals of the first output lines by the signal holding units;
after the third step, a fourth step of converting a signal of the holding unit into a digital signal by the analog to digital conversion circuit;
after the third step and before an end of the fourth step, a fifth step of applying the non-selection reset voltage to the input node of the amplifying portion of the first pixel unit by the reset portion of the first pixel unit, and of simultaneously applying the selection reset voltage to the input node of the amplifying portion of the second pixel unit by the reset portion of the second pixel unit; and
after the fourth step, a sixth step of transferring a signal of one of the plurality of photoelectric conversion portions of the second pixel unit to the input node of the amplifying portion of the second pixel unit by corresponding one of the plurality of transfer portions of the second pixel unit, and of outputting an amplified signal to the first output line by the amplifying portion of the second pixel unit.

8. The driving method according to claim 7, further comprising, after the fourth step before the sixth step, a seventh step of applying the selection reset voltage to the input node of the amplifying portion of the second pixel unit by the reset portion of the second pixel unit.

9. The driving method according to claim 8, wherein
the fifth step is performed, after the third step and more than a period before a start of the seventh step, the period from when the first step is started until the third step is ended.

10. The driving method according to claim 7, wherein,
the fifth step is performed after the third step and before a beginning of the fourth step.

11. The driving method according to claim 7, wherein,
the amplifying portion comprises an N-channel MOS transistor, and the selection reset voltage is higher than the non-selection reset voltage.

12. The driving method according to claim 7, further comprising a plurality of reset voltage lines, each connected to the plurality of pixel units arranged in a corresponding row of the plurality of rows,
wherein the reset portion configured to selectively apply, from the reset voltage line to the input node, a selection reset voltage and a non-selection reset voltage.

13. An imaging apparatus comprises:
a plurality of pixel units arranged in a matrix composed of a plurality of columns and a plurality of rows;
a plurality of first output lines, each connected to the plurality of pixel units arranged in a corresponding column of the plurality of columns;
a plurality of signal holding units configured to respectively hold signals of the plurality of first output lines;
a plurality of read out units configured to read out, to a second output line, signals of the signal holding units; and
a scanning circuit configured to control the plurality of read out units, wherein
each of the plurality of pixel units has:
a plurality of photoelectric conversion portions configured to generate a signal by a photoelectric conversion;
an amplifying portion configured to amplify a signal from the photoelectric conversion portion and output an amplified signal to the first output line;

a plurality of transfer portions configured to respectively transfer signals from the plurality of photoelectric conversion portions to an input node of the amplifying portion; and a reset portion configured to selectively apply, to the input node, a selection reset voltage and a non-selection reset voltage, and wherein the plurality of pixel units include a first pixel unit and a second pixel unit, the reset portion of the first pixel unit applies the selection reset voltage to the input node of the amplifying portion of the first pixel unit;

thereafter, one of the plurality of transfer portions of the first pixel unit transfers a signal of corresponding one of the plurality of photoelectric conversion portions of the first pixel unit to the input node of the amplifying portion of the first pixel unit, the amplifying portion of the first pixel unit outputs an amplified signal to the first output line, and the amplified signal of the first output line is held in the signal holding unit;

thereafter, the scanning circuit sequentially turns on the plurality of read out units, so as to read out signals held in the holding units to the second output line;

after the amplified signal of the first output line is held in the signal holding unit, and before an end of the reading out of the signals held in the holding units, the reset portion of the first pixel unit applies the non-selection reset voltage to the input node of the amplifying portion of the first pixel unit, and the reset portion of the second pixel unit simultaneously applies the selection reset voltage to the input node of the amplifying portion of the second pixel unit; and after the end of the reading out of the signals held in the holding units, one of the plurality of transfer portions of the second pixel unit transfers a signal of corresponding one of the plurality of photoelectric conversion portions of the second pixel unit to the input node of the amplifying portion of the second pixel unit, and the amplifying portion of the second pixel unit output an amplified signal to the first output line.

* * * * *